United States Patent [19]

Fellrath et al.

[11] 4,237,548
[45] Dec. 2, 1980

[54] ELECTRONIC TIMEPIECE

[75] Inventors: Jean Fellrath, Neuchatel; Jean-Félix Perotto, Hauterive; Ali Schneiter; Maurice Grimm, both of Neuchatel, all of Switzerland

[73] Assignee: Ebauches S.A., Neuchatel, Switzerland

[21] Appl. No.: 8,238

[22] Filed: Feb. 1, 1979

[30] Foreign Application Priority Data

Feb. 6, 1978 [CH] Switzerland ............... 1271/78

[51] Int. Cl.³ ............... G04C 17/00; G04C 19/00; G04C 9/00
[52] U.S. Cl. ............... 368/69; 368/82; 368/187; 368/224
[58] Field of Search ............... 58/23 R, 50 R, 23 BA, 58/85.5; 307/116 R

[56] References Cited

U.S. PATENT DOCUMENTS

| | | | |
|---|---|---|---|
| 3,983,690 | 10/1976 | McClintock | 58/23 R |
| 4,090,353 | 5/1978 | Maeda et al. | 58/23 R |

*Primary Examiner*—Vit W. Miska
*Attorney, Agent, or Firm*—Silverman, Cass & Singer, Ltd.

[57] ABSTRACT

Electronic timepiece having an electro-optic passive display cell comprising an oscillator used as a time base and an electronic control circuit of its several functions. The electronic circuit is operable by means of a stationary key or switch, having a capacitive action, carried by the glass or crystal of the timepiece. The stationary key is fed by the oscillator through a fixed or non-variable condenser. A conductive element is interposed between the stationary key and the display cell, the conductive element constituting one of the electrodes of the fixed condenser. The purpose of this arrangement is to eliminate the influence of a parasitic condenser constituted by the electrodes of the display cell and the electrode of the stationary key.

8 Claims, 8 Drawing Figures

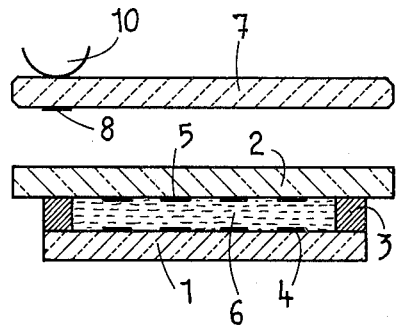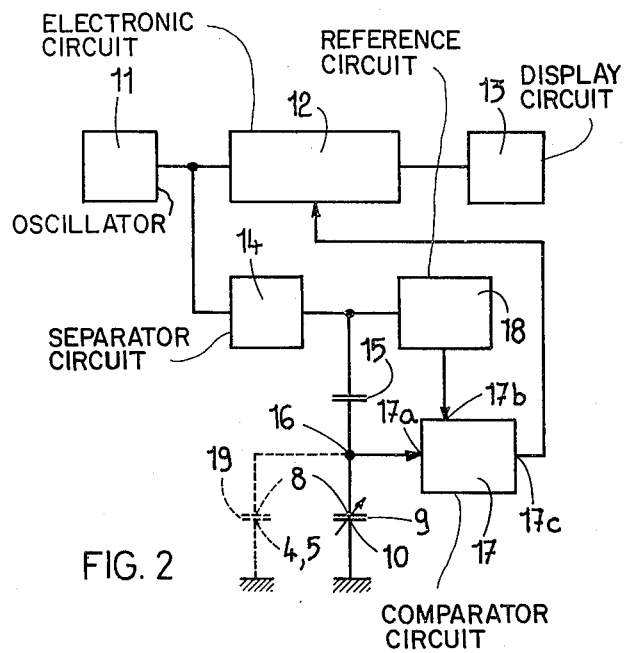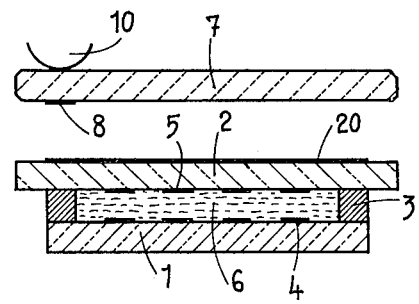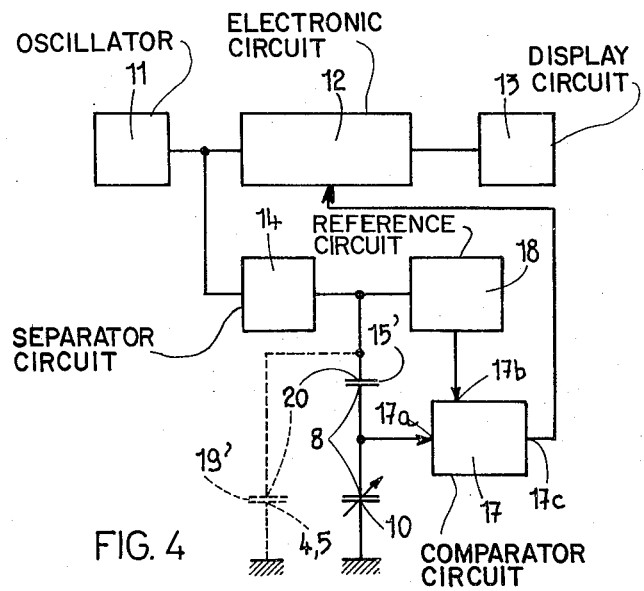

ELECTRONIC TIMEPIECE

BACKGROUND OF THE INVENTION

The present invention relates to an electronic timepiece having an electro-optic passive display cell. The timepiece comprises an oscillator used as a time base and an electronic control circuit for the several functions of the timepiece. The control circuit is operable by means of at least one stationary key or switch having a capacitive action which is carried by the glass or crystal of the timepiece and which is fed, at least indirectly, by the oscillator through a fixed condenser.

Such timepieces are known and FIG. 1 shows diagrammatically the section of a portion of one of such timepiece, that is to say a watch provided with a display cell having liquid crystals. This cell is composed, mainly, of a rear plate 1 and of a front plate 2, separated from each other by a frame 3. These plates carry electrodes 4 and 5 respectively, which are intended to create an electric field in the space which separates them, and which space is filled with a liquid crystal 6.

The glass or crystal, designated by 7, of this watch, covers the whole and carries, on its inner face, an electrode 8, forming a stationary key, which constitutes one of the plates of a variable condenser 9, shown in FIG. 2, which figure represents a block diagram of the watch. The other plate of condenser 9 is constituted by the finger of the user, represented at 10, which is put to ground of the watch by the intermediary of the bottom of the casing of the watch. Ground is also connected to one of the poles of the source of voltage, not represented, feeding all the circuits of the watch.

The block diagram of FIG. 2 represents the conventional circuits of the watch, that is to say an oscillator 11, used as a time base, and an electronic circuit 12 comprising the frequency dividers and all the annexed circuits such as the resetting circuit, the alarm circuit, the circuit of chronograph, etc. . . . This circuit 12 delivers, especially, the signals which are necessary for the display circuit 13 to display the time information.

The oscillator 11 delivers also a signal, through a separator stage 14, to a capacitive divider comprising a fixed condenser 15, which is integrated into the circuit of the watch or at least, mounted in proximity thereof as a discrete element and which is connected in series with the variable condenser 9 constituted, as disclosed hereabove, by the electrode 8 and the finger 10 of the user. Consequently, condenser 9 has a non-negligible capacity only when the user puts his finger to the crystal 7 opposite the electrode 8. The rest of the time, its capacity is very low and its impedance is high.

The point 16 which is common to the two condensers 9 and 15 is connected to the input 17a of a comparator circuit 17 which receives, on a second input 17b, a reference signal delivered by a circuit 18 which is also connected to the output of the separator 14.

The comparator 17 is arranged so as to deliver at its output 17c a logical signal, used for the control of the several functions of the electronic circuit 12. The output 17c takes, for instance, the logic states 0 to 1 according to whether the signal applied to the input 17a has an amplitude greater or smaller than that of the reference signal, that is to say whether the impedance of the variable condenser 9 is great or small, or still whether the user does not put or does put his finger onto the stationary key.

The electrodes 4 of the display cell are connected, in a not shown way, to the ground of the watch. The electrodes 5 are, on their side of the liquid crystal connected, by the control circuit of the display to one or the other of the poles of the votage source according to the information which has to be displayed. These electrodes 4 and 5 constitute consequently, with the electrode 8 of the stationary key, a parasitic variable condenser 19, represented in dotted lines in FIG. 2. This parasitic condenser 19 is connected in parallel with the condenser 9 and reduces the margin of safety existing between the activated and non-activated states of the stationary key.

The purpose of the present invention is to remove the influence of this parasitic condenser.

SUMMARY OF THE INVENTION

To this effect, the timepiece of the invention includes a conductive element interposed between the stationary key and the display cell, the conductive element constituting one of the electrodes of the fixed condenser.

BRIEF DESCRIPTION OF THE DRAWINGS

In the annexed drawings,

FIGS. 1 and 2, already mentioned, represent diagrammatically a known watch, while FIGS. 3 to 8 represent several embodiments of the invention herein.

FIG. 3 is a diagrammatic elevational view of a part of a first embodiment of an electronic watch having an electro-optic passive display cell.

FIG. 4 is a block diagram of the circuit of the watch of FIG. 3, and

FIGS. 5 to 8 are diagrammatic elevational views of a part of four other embodiments of electronic watches.

DESCRIPTION OF THE PREFERRED EMBODIMENT

Figure 5:
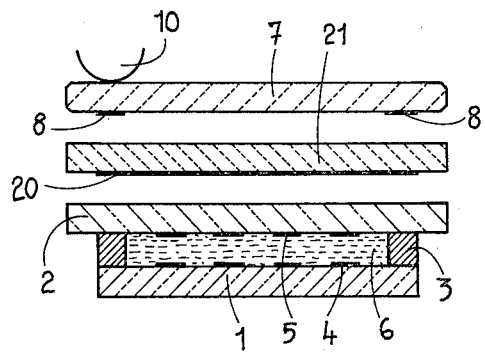

The elements of FIGS. 1 and 2 hereabove disclosed and the corresponding elements of FIGS. 3 to 8 are provided with the same reference numerals.

The watch illustrated in FIGS. 3 and 4 differs from that of FIGS. 1 and 2 by the fact that a conductive transparent film 20 is deposited on the outer face of the plate 2 or at least on the portion of plate 2 situated opposite the electrode 8. This film is connected, in a not shown way, with the output of the separator circuit 14 and constitutes the first plate of a fixed condenser 15′ which plays the same role as the condenser 15 of FIG. 2.

The electrode 8, which continues to form the stationary key, constitutes now at the same time the first plate of the variable condenser 9 and the second plate of the fixed condenser 15′. Consequently, fixed condenser 15′ is no longer incorporated in the circuit of the watch, and is no longer mounted in the vicinity of the circuit as a discrete component.

There exists also in this case, obviously, a parasitic variable condenser, desiganted by 19′, but variable condenser 19′ is now formed by the conductive film 20 and by the electrodes 4 an 5 of the display. Consequently, it is connected between the output of the separator circuit 14 and the ground of the watch, as indicated in dotted lines in FIG. 4, and is no longer connected to the input of the comparator 17.

The separator 14 can easily be arranged in such a way that the signal it delivers is not influenced by the variations of the capacity of parasitic condenser 19′. Moreover, since the output signal of the separator 14 is applied at the same time to the capacitive divider and to the reference circuit 18, the influences which could subsist are found, practically, at the two inputs of the comparator circuit 17, so that their effect is thus eliminated. The margin of safety between the two states—activated and not activated—of the stationary key is consequently highly increased with respect to what happens in the case of FIGS. 1 and 2.

Figure 6:
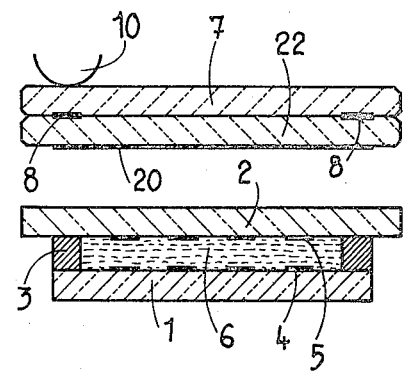

As a modification, one can also provide the case where the crystal 7 of the watch will carry several electrodes 8 constituting as many stationary keys and forming with each, with a part of the conductive film 20 with which it is opposite, a fixed condenser 15' as is the case in the embodiments of FIGS. 5 and 6.

These two embodiments differ from that of FIG. 3 only by the fact that the conductive transparent film 20 is not carried by the front plate 2 of the display cell, but by supplementary glass plates 21 and 22 respectively, interposed between the cell and the crystal 7 of the watch.

In the embodiment of FIG. 5, the plate 21 is maintained at a certain distance from the glass 7 and from the display cell by securing means which have not been represented, and in the embodiment of FIG. 6, the supplementary plate 22 is directly stuck to the crystal 7, under the supplementary plate 22.

These two embodiments have the advantage, with respect to the embodiment of FIG. 3, of moving the conductive film 20 away from the electrodes 4 and 5 of the display cell, which reduces the capacity of the parasitic condenser 19'. Moreover, the embodiment of FIG. 6 has the supplementary advantage of reducing the distance between the film 20 and the electrodes 8, which increases the capacity of the fixed condenser 15'.

Figure 7:
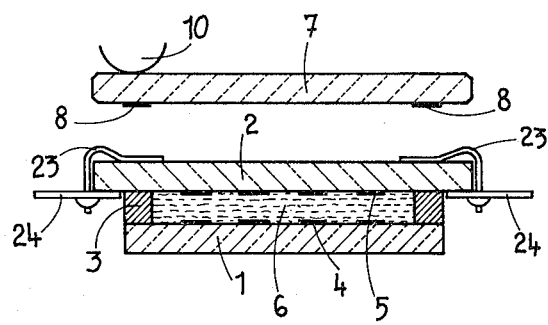

In the embodiment of FIG. 7, a cell frame 23, which mechanically secures the display cell also is electrically connected to the printed circuit 24 of the watch and, therefore, to the electronic circuit of the watch. This cell frame can thus play the role of the conductive film 20 of FIGS. 3, 5 and 6.

Figure 8:
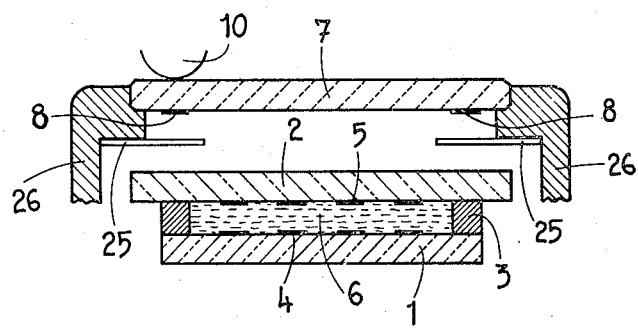

In the embodiment of FIG. 8, a false dial 25 is used for masking the periphery of the display cell. It is secured to the bezel 26 of the watch and is connected electrically, in a conventional but not represented way, with the electronic circuit. It is this false dial 25 which then plays the role of the conductive film 20. It is obvious that, in this case, the bezel 26 must be made of an insulating material or, if it is metallic, an insulation must be provided between the bezel 26 and the false dial 25.

Another advantage of the embodiment of FIGS. 5 to 8 lies in the fact that the display cells do not need to be specially manufactured since they do not have to be covered by a conductive transparent film, which could be applied thereon only by means of a supplementary manufacturing operation.

It is obvious that the invention is not limited to the watches having liquid crystal displays, as disclosed, but that it could also be applied, and with the same advantages, to the watches provided with passive display devices of other types, such as the electro-chromic displays for instance.

According to the arrangement selected for the several electrodes, it can occur that the condenser 15' does not have a sufficient capacity so as to feed correctly the capacitive key. One will then provide a single make-up or additional condenser, connected in parallel with the condenser 15', which can, generally, owing to its low capacity, be integrated with the other electronic elements of the watch.

What we claim is:

1. An electronic timepiece having a crystal with an inner face adjacent an electro-optic passive display cell and having several functions, comprising:
    oscillator means producing a timebase signal;
    electronic circuit means for controlling the several functions of the timepiece operable by means of at least one stationary key, the stationary key having a capacitive action and being carried on the inner face of the crystal, the stationary key being coupled to the timebase signal by a fixed condenser, and
    a conductive element interposed between the stationary key and the display cell and constituting one of the two electrodes of the fixed condenser to reduce the influence of a parasitic condenser formed by the plates of the electro-optic passive display cell on the stationary key.

2. The timepiece as claimed in claim 1 in which the conductive element is coupled to the timebase signal and the stationary key constitutes the oher electrode of the fixed condenser.

3. The timepiece as claimed in claim 2 in which the conductive element is constituted by a transparent conductive film.

4. The timepiece as claimed in claim 3 in which the display cell has a front face adjacent the inner face and the transparent conductive film is deposited on the front face.

5. The timepiece as claimed in claim 3 further including a transparent plate of insulating material having two opposed faces, the plate being interposed between the crystal and the display cell and in which the transparent conductive film is deposited on one of the faces of the transparent plate.

6. The timepiece as claimed in claim 5 in which one of the faces of the transparent plate is applied to the inner face of the crystal and the transparent conductive film is deposited on the other face of the plate.

7. The timepiece as claimed in claim 2 further including a securing frame of the display cell and in which the conductive element is constituted by the securing frame.

8. The timepiece as claimed in claim 2 further including a false dial and in which the conductive element is constituted by the false dial.

* * * * *